(12) United States Patent
Pitwon et al.

(10) Patent No.: US 10,928,601 B2
(45) Date of Patent: Feb. 23, 2021

(54) NETWORK TOPOLOGY MODULES

(71) Applicant: Seagate Technology LLC, Cupertino, CA (US)

(72) Inventors: Richard C. A. Pitwon, Fareham (GB); Alexander C. Worrall, Waterlooville (GB)

(73) Assignee: Seagate Technology LLC, Fremont, CA (US)

( * ) Notice: Subject to any disclaimer, the term of this patent is extended or adjusted under 35 U.S.C. 154(b) by 0 days.

(21) Appl. No.: 15/898,913

(22) Filed: Feb. 19, 2018

(65) Prior Publication Data
US 2019/0258011 A1 Aug. 22, 2019

(51) Int. Cl.
*G02B 6/42* (2006.01)
*G02B 6/38* (2006.01)
*H05K 7/14* (2006.01)
*G02B 6/44* (2006.01)
*H04B 10/272* (2013.01)
*H04L 12/24* (2006.01)

(52) U.S. Cl.
CPC ......... *G02B 6/4281* (2013.01); *G02B 6/3897* (2013.01); *G02B 6/4452* (2013.01); *H04B 10/272* (2013.01); *H04L 41/12* (2013.01); *H05K 7/1488* (2013.01); *G02B 6/4284* (2013.01)

(58) Field of Classification Search
CPC .. G02B 6/3897; G02B 6/4252; G02B 6/4281; G02B 6/4284; H05K 7/1488; H05K 7/0021; H05K 5/0021; H05K 7/20709; H04B 10/27; H04B 10/272; H04B 10/801; H04L 67/1097; H04L 41/12

USPC ...... 385/14, 15, 24, 32, 53, 88–92, 134–135
See application file for complete search history.

(56) References Cited

U.S. PATENT DOCUMENTS

| | | | |
|---|---|---|---|
| 9,645,317 B2 | 5/2017 | Isenhour et al. | |
| 2001/0011314 A1* | 8/2001 | Gallagher | G06F 9/4406 710/302 |
| 2002/0104039 A1* | 8/2002 | DeRolf | G06F 11/2257 714/30 |
| 2005/0169311 A1* | 8/2005 | Millet | H04L 1/0083 370/471 |
| 2006/0158866 A1* | 7/2006 | Peterson | H05K 7/1491 361/796 |
| 2009/0148116 A1* | 6/2009 | Yanagimachi | G02B 6/43 385/135 |
| 2016/0007102 A1 | 1/2016 | Raza et al. | |

(Continued)

OTHER PUBLICATIONS

DeCusatis, "Optical Networks," *The Optical Communications Reference*, 1st Edition, 2009, Title page, Publication Information, Table of Contents, and pp. 307-456.

(Continued)

*Primary Examiner* — Michael P Mooney
(74) *Attorney, Agent, or Firm* — Mueting Raasch Group

(57) ABSTRACT

An apparatus and system that includes a plurality of data devices, a network module, and a chassis. The network module may include an interface defining couplings and channels extending between the couplings defining a network topology for interconnecting data devices. The chassis may be configured to receive data devices and the network module to operably couple the received data devices via the interconnect topology defined by the network module.

18 Claims, 4 Drawing Sheets

(56) References Cited

U.S. PATENT DOCUMENTS

2017/0010421 A1 1/2017 Pitwon et al.
2017/0099187 A1 4/2017 Dale et al.

OTHER PUBLICATIONS

DeCusatis, "Small form factor fiber optic connectors," *The Optical Communications Reference, 1ˢᵗ Edition*, 2009, Title page, Publication Information, Table of Contents, and pp. 227-239.
Doany, et al., "Terabit/s-Class Optical PCB Links Incorporating 360-Gb/s Bidrectional 850 nm Parallel Optical Transceivers," Feb. 15, 2012, *Journal of Lightwave Technology*, 30(4):560-571.

* cited by examiner

NETWORK TOPOLOGY MODULES

The present disclosure relates to network topology modules and apparatus and systems for use therewith.

SUMMARY

Various aspects of the present disclosure relate to a module comprising, or including, an optical interface and a plurality of optical channels. The optical interface may comprise a plurality of optical couplings to interconnect a plurality of data devices and the plurality of optical channels may extend between and be operably coupled to the plurality of optical couplings to define one of a plurality of different interconnect topologies for interconnecting the data devices.

Further, various aspects of the present disclosure relate to a system comprising, or including, a network module and a chassis to receive one or more data devices and the network module. The network module may include an optical interface, comprising a plurality of optical couplings, and a plurality of optical channels extending between the optical couplings to define a network topology for interconnecting one or more data devices. The chassis may receive the network module to operably couple one or more data devices via the network topology defined by the plurality of optical channels of the network module.

Still further, various aspects of the present disclosure relate to an apparatus comprising two or more network modules and a chassis. Each network module may define a different network topology for interconnecting data devices to each other. The chassis may include a plurality of data device receivers to receive data devices and a network module receiver to receive a network module of the two or more network modules. The chassis may operably couple each of the data devices received by the plurality of data device receivers to the network module received by the network module receiver.

It is to be understood that both the foregoing general description and the following detailed description present embodiments of the subject matter of the present disclosure, and are intended to provide an overview or framework for understanding the nature and character of the subject matter of the present disclosure as it is claimed.

BRIEF DESCRIPTION OF THE DRAWINGS

The accompanying drawings are included to provide a further understanding of the subject matter of the present disclosure and are incorporated into and constitute a part of this specification. The drawings illustrate various embodiments of the subject matter of the present disclosure and together with the description serve to explain the principles and operations of the subject matter of the present disclosure. Additionally, the drawings and descriptions are meant to be merely illustrative and are not intended to limit the scope of the claims in any manner.

Figure 1:
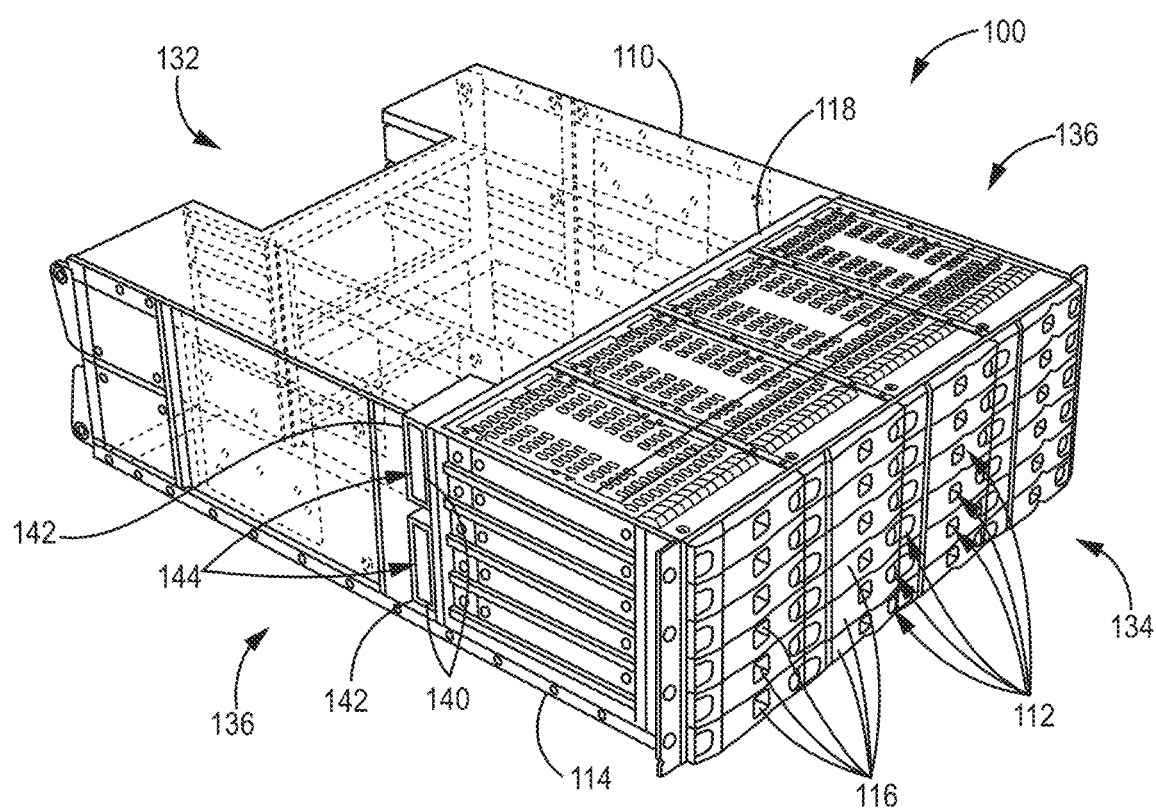
FIG. 1 is a schematic diagram of an example apparatus for selectively modifying an optical interconnect topology between data devices, according to an example of the present disclosure.

In the following detailed description, reference is made to several specific embodiments. It is to be understood that other embodiments are contemplated and may be made without departing from the scope or spirit of the present disclosure. The following detailed description, therefore, is not to be taken in a limiting sense.

DETAILED DESCRIPTION

The example systems, apparatuses, and methods described herein relate to interconnect topology between data devices such as servers, switches, nodes, data drives, etc. in a data management system in which the interconnection between the devices is passive (e.g., implemented through optical links). In some embodiments of the present disclosure, a data management system includes one or more topology modules, each implementing different interconnect topologies for the data devices so that different interconnect topologies for the system may be implemented by changing topology modules.

Data management systems may include storage devices and servers and may be connected to a network for convenient access. The popularity of cloud networks for the storage of data has increased the demand for higher storage densities while simultaneously improving access bandwidth to the data. As data centers become more optically interconnected and the possible architectures that are enabled by the removal of distance limitations proliferate, it will become very useful to be able to accommodate different architectures and topologies without changing the entire system enclosure. The present disclosure provides an apparatus and systems that enable changing the interconnect topology of a data center system such as a storage, switch, or compute enclosure/chassis to accommodate either different internal or external topologies without the need to change the entire enclosure/chassis. In at least one embodiment, it may be described that the internal interconnect topology of a data center system enclosure/chassis may be changed by providing, within the enclosure/chassis, a generic, fixed-internal optical interconnect network module receiver, which is mapped into a given topology through one or more pluggable, interchangeable optical modules.

The apparatus for enabling selection of a desired optical interconnect topology between data devices of the present disclosure may be included in a data management system in which internal high-speed connections between data devices are implemented through optical links, such as optical fiber jumpers, flexplanes or other connectors. Each of the optical links connecting the data devices may be selectively capable of passing through one or more network modules, depending upon the configuration of specific optical channels formed within a given selected network module. As a result, rather than having direct fixed optical links connecting the data devices to each other according to a specific topology, a current interconnect topology may be replaced by a different interconnect topology by removing the network module configured to define the current interconnect topology and replacing the network module with another network module configured to enable a different interconnect topology between the data devices.

In one example, the network module may be a passive fiber shuffle cassette with a high-density pluggable optical input/output (I/O) interface located on the connecting end of the cassette and a given interconnect network topology fixed within, or defined by, the cassette. Depending on how the optical fibers in the network module are mapped to the connector interfaces of the network module, a given interconnect topology between the data devices will be implemented. Further, it may be described that the exemplary network modules are passive, meaning that such network modules include no additional electronics or require no power to operate. In one or more embodiments, the exemplary network modules may be optically pluggable and interchangeable such that different interconnect topologies for the data devices may be selected and implemented by removing the network module that is currently being utilized and inserting another network module defining a different interconnect topology for interconnecting the data devices.

Reference will now be made to the drawings, which depict one or more aspects described in this disclosure. However, it will be understood that other aspects not depicted in the drawings fall within the scope and spirit of this disclosure. Like numbers used in the figures refer to like components, steps and the like. However, it will be understood that the use of a reference character to refer to an element in a given figure is not intended to limit the element in another figure labeled with the same reference character. In addition, the use of different reference characters to refer to elements in different figures is not intended to indicate that the differently referenced elements cannot be the same or similar.

An exemplary system 100 for selectively modifying an optical interconnect topology between data devices, according to an example of the present disclosure is depicted in FIG. 1. As shown, the exemplary system 100 may include a chassis, or enclosure, 110, a plurality of data devices 112 (a few of which are labeled in FIG. 1), and a pluggable, interchangeable network module 144 for selectively modifying an optical interconnect topology between the data devices 112.

Although a single chassis 110 is depicted in FIG. 1, it is to be understood that more than a single chassis 110 may be utilized by the exemplary system 100 described herein. Further, each chassis 110 may be maintained or supported by one or more storage racks (e.g., one or more than one chassis 110 may be mounted in, or held by, a storage rack). Each chassis 110 may include multiple removable and insertable sleds, carriers, or drawers 116 (a few of which are labeled in FIG. 1) located within a housing 114 of the chassis 110. Each of the sleds, or drawers 116 may be configured to receive, or hold, the data devices 112, which may be servers, storage devices, or both. Storage devices may be hard disk drives, flash drives, solid state drives, or any other device suitable for storing data, for example. Servers may be application modules or any other compute modules, which may be structured to functionally execute the operations of the server. The compute modules may be implemented in hardware and/or as computer instructions on a non-transient computer readable storage medium, and modules may be distributed across various hardware or computer-based components.

In one example, the chassis 110 may takes a 36/2 U array configuration with 36 data devices 112 in a 2 U (i.e., a rack unit (abbreviated U or RU) is a unit of measure defined as 44.50 millimetres (1.75 in)) form factor height storage enclosure housing 114. A variety of other configurations can be used including a chassis 110 with a total of N drives where N=12, 16, 20, 24, 30, 32, 48, etc. Other heights can be used as well, such as 3 U, 4 U, 5 U, etc.

As described herein, the removable and insertable sleds, or drawers 116 function as data device receivers that are used to receive and secure a set of data devices 112 in the array. The sleds 116 can be individually removed and inserted from/to the housing 114 of the chassis 110. The sleds 116 may include, among other things, sled electronics to provide status indications and other control features during enclosure operation. While the sleds 116 in these embodiments may support the data devices 112 in a horizontal orientation (e.g., the length and width dimensions of the storage devices are parallel to the overall length and width dimensions of the enclosure housing 114), the sleds 116 can alternatively support the data devices 112 in a vertical orientation (e.g., "on edge" so that the length and width dimensions of the data devices 112 are orthogonal to the length and width dimensions of the enclosure 110).

The chassis 110 may further include a printed circuit board (PCB) 118 to provide electrical interconnection paths for the various data devices 112 and sled electronics of the sleds 116. In at least the example depicted, the PCB 118 may be mounted in a transverse direction across the enclosure housing 114. Further, it may be described that the PCB 118 is located at a medial location within the enclosure housing 114 between a front side 134 and a rear side 132 of the enclosure housing 114, and such a construction is commonly referred to as a midplane. In alternative equivalent embodiments the PCB 118 can otherwise be located at or toward the rear side 132 of the enclosure housing 114, what is commonly referred to as a backplane. For purposes of this disclosure and meaning of the claims the term "midplane" generally refers to a transverse PCB such as the depicted midplane, a backplane, a combination, and the like. The PCB 118 may take the form of a fixed multi-layer printed circuit board assembly (PCBA) with various electrical and optical connectors, signal traces, vias, waveguides, fiber optics, etc. to establish the electrical and optical signal and power pathways.

Alternatively, the PCB 118 may take a flexible configuration in which one or more flex circuits (e.g., cables, optical fibers, etc.) are used to maintain electrical and optical interconnections of the data devices 112 and sleds 116. When a rigid PCB 118 is used, movement of the sled 116 away from the enclosure 110 will generally result in the associated data device 112 being electrically and/or optically disconnected from the enclosure 110. Further, when a sled 116 is moved away from the enclosure 110 when a flexible PCB is utilized 118, the flexible PCB 118 may allow sled 116 and the associated data device 112 to remain electrically and/or optically connected to the enclosure 110.

Further, it may be described that the PCB 118 operably couples each of the data devices 112 within the sleds 116, including both operably coupling data devices 112 within a single sled 116, and operably coupling data devices 112 between different sleds 116, within in single enclosure, or chassis, 110, or within two or more separate enclosures, or chassis, 110.

In order to enable selective modification of an optical interconnect topology between data devices 112, the system 100 may further include a network module receiver 140 positioned about the chassis 110. The network module receiver 140 may be configured to receive a network module 144, which as described herein may be for selectively modifying an optical interconnect topology between the data devices 112. To perform such functionality, the network module receiver 140 may be operatively coupled to each of the data devices 112 contained, or held, by the sleds 116, when, for example, the sleds 116 are operatively coupled to and received by the chassis 110 so as to be operatively coupled to PCB 118 (to operatively couple the data devices 112 to the PCB 118). As shown in FIG. 1, the system 100 includes two network module receivers 140 so as to receive two network modules 144. It is to be understood that other embodiments may include a single network module receiver 140 or more than two network module receivers 140.

The network module receiver 140 may be positioned, or located, in a variety of different places about the chassis 110. For example, as illustrated in the example of FIG. 1, the network module receiver 140 may be operatively coupled to and positioned on the printed circuit board 118, which in this example is located medially between the front side 134 and the rear side 134 of the chassis 110 (which may be referred to as a midplane). However, in other examples, the network module receiver 140 may be positioned along, or proximate, the rear side 132 of the chassis 110, or alternatively, positioned along, or proximate, the front side 134 of the chassis 110. In these examples where the network module receiver 140 is positioned at the front side 134 or the rear side 132, various apparatus such as electrical circuitry, optical couplings/channels, etc. may interconnect, or operatively couple, the network module receiver 140 to the PCB 118. In other embodiments, more than one PCB 118 may be utilized, each of which are operatively coupled using various apparatus. In yet another example, the network module receiver 140 may be positioned along, or proximate, one of the sides 136 of the chassis 110 (the sides 136 extend between the front side 134 and the rear side 132 of the chassis 110).

In at least one example, an opening 142 may be defined in, or formed by the network module receiver 140 to receive network modules 144. Once a network module 144 is received within an opening 142, the network module 144 may be operatively coupled to the network module receiver 140, and in turn, may be operatively coupled to the PCB 118, which further, in turn, may be operatively coupled to the plurality of data devices 112. In the example shown in FIG. 1, the network module receiver 140 is positioned only on one side of the chassis 110 medially between the front side 134 and the rear side 132 of the chassis 110. However, in another example, network module receivers 140 may be positioned on one or both sides of the chassis 110 medially between the front side 134 and the rear side 132 of the chassis 110, so that one or more network modules 144 may be utilized to connect devices from both front and back side to each other, and may further enable passive optical channels to be connected straight out of the enclosure without passing through a data device in the enclosure to allow direct connectivity to external fabric.

In other words, the exemplary systems and apparatus may include a chassis 110 that includes a plurality of sleds, or data device receivers 116 which may receive and secure data devices 112. The chassis 110 includes a network module receiver 140 to receive a network module 144. The network module 144, when received by the network module receiver 140, may be operably coupled to the data devices 112 received by or within the sleds, or data device receivers, 116. The network module 144 may be generally described as defining a network topology for the data devices operably coupled thereto. In some embodiments, the network module 144 may operably couple a plurality of the data devices using a desired, or selected, network topology.

Further, in at least one embodiment, the bays, or slots, of the chassis 110 within which the plurality of sleds, or data device receivers, 116 are received by may also be used to receive and operability couple a network module 144 to the PCB 118. In essence, the network module 144 may be treated like another data device 112 in the system 100. Thus, a bay, or slot, of the chassis 110 may be the network module receiver 140. In one embodiment, the network module 144 may be received by a sled 116, and then inserted into a bay, or slot, of the chassis 110 to be operably coupled to the PCB 118, and in turn, the plurality of data devices 112 to operably couple and define a network topology for such data devices 112. In another embodiment, the network module 144 may be received directly by a bay, or slot, of the chassis 110 to be operably coupled to the PCB 118, and in turn, the plurality of data devices 112 to operably couple and define a network topology for such data devices 112. Further, in one embodiment where one or more slots of the chassis 110 is the network module receiver 140, each slot of the chassis 110 may be used as the network module receiver 140 or a data device receiver (e.g., configured to receive a sled 116 holding a data device). Thus, each slot of the chassis 110 may include all of the operable couplings for data devices 112 and network modules 144. Still further, in one embodiment where one or more slots of the chassis 110 is the network module receiver 140, only designated, or selected slots of the chassis 110 may be used as the network module receiver 140. Thus, only the designated, or selected, slots of the chassis 110 may include all of the operable couplings for the network modules 144.

Figure 2:
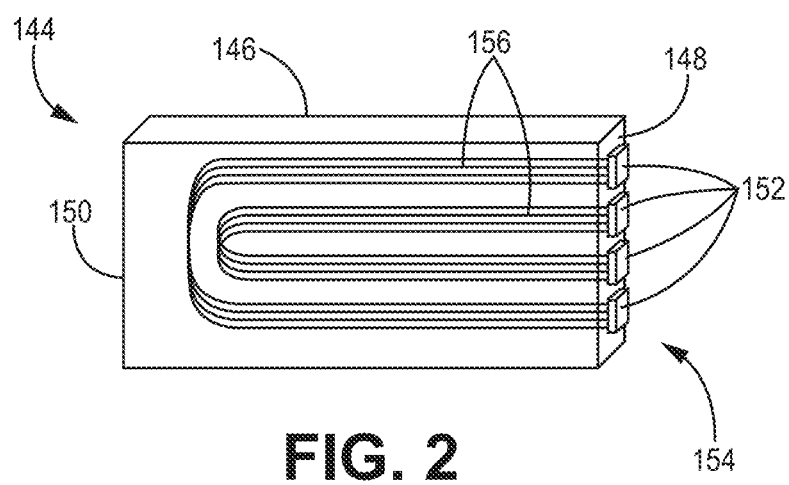
FIG. 2 is a schematic diagram of an example network module for selectively modifying an optical interconnect topology between data devices in a data management system, according to the present disclosure.

FIG. 2 is a schematic diagram of an exemplary network module 144 for use in selectively modifying an optical interconnect topology between data devices 112, in a data management system such as the system 100 depicted in FIG. 1. As illustrated, the network module 144 may include a housing 146 extending from a front portion 148 to a rear portion 150. The housing 146 may be sized and shaped so as to be received by the chassis 110 via the network module receiver 140 (e.g., sized and shaped to be received by a network module opening 142, sized and shaped to be received by a slot of the chassis 110).

The network module 144 may further include an interface 154 defining a plurality of couplings 152. In this embodiment, the front portion 148 of the network module includes the couplings 152 formed along the optical interface 154. The interface 154, and the plurality of couplings 152 thereof, may be configured to be operably coupled to a corresponding interface defining a plurality of couplings of the network module receiver 140. The network module 144 may further include a number of channels 156 extending within the housing 146 between the couplings 152. The channels 156 may be configured to define a network topology for interconnecting a desired combination of data devices 112.

As described herein, the network module 144 and the remainder of the system 100 may include one or both of electrical and optical connectivity, and as such, the couplings 152 and the channels 156 may include one or both of electrical and optical varieties. Thus, the couplings 152 may be optical couplings configured to be operably coupled to optical couplings of the network module receiver 140 and the channels 156 may be optical channels. The optical channels may be any apparatus or structure configured to, or operable to, transmit optical signals for use in data transfer. For example, the optical channels may include optical fibers, optical waveguides, free space optical paths, etc. for transmitting optical signals encoded onto light to transmit information.

Thus, the couplings 152 may be electrical couplings 152 configured to be operably coupled to electrical couplings of the network module receiver 140 and the channels 156 may be electrical channels. The electrical channels may be any apparatus or structure configured to, or operable to, transmit electrical signals for use in data transfer. For example, the electrical channels may include wires, PCB traces, semiconductors, etc. for transmitting signals encoded onto electrical signals to transmit information.

Further, the network module 144 may be described as being formed to be inserted within the network module opening 142 of the network module receiver 140 and advanced within the network module receiver 140 so that the couplings 152 may operatively couple the desired one or more data devices 112 via the printed circuit board 118. Once operably coupled to the PCB 118, the network module 144 may be described as operatively coupling the data devices 112 according to the defined network topology associated with the channels 156 formed within the network module 144 and extending between the couplings 152.

In particular, when the network module 144 is inserted within the opening 142 of the network module receiver 140, the couplings 152 of the optical interface 154 may engage couplings 246 (shown in FIG. 3) within the network module receiver 140 and may operably couple the network module 144 and the network module receiver 140. Therefore, the network module receiver 140 is operably coupled to the PCB 118 of the chassis 110, which as described above, operably couples the data devices 112 within each of the sleds 116. The network module 144 may be further described as being able to operably couple data devices 112 of a single sled 116, or operably couple data devices 112 within multiple sleds 116 in a single chassis 110 or within two or more separate chassis 110.

Figure 3:
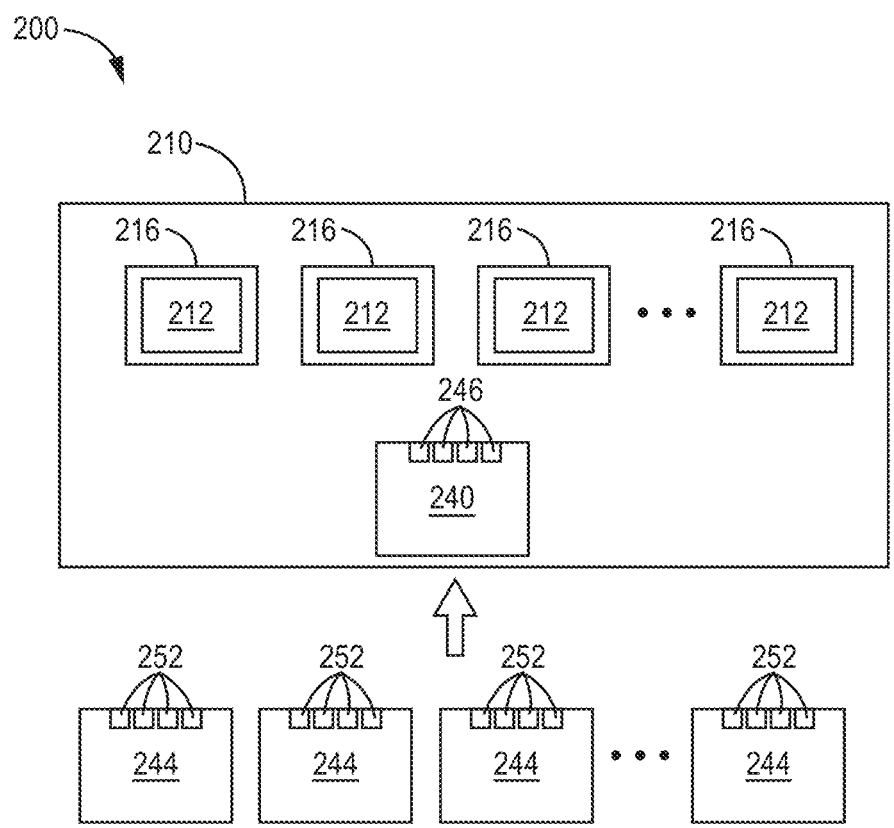
FIG. 3 is a schematic block diagram of an apparatus that includes selectively modifying an optical interconnect topology between data devices, according to an example of the present disclosure.

FIG. 3 is a schematic block diagram of an apparatus that includes selectively modifying an optical interconnect topology between data devices, according to an example of the present disclosure. As illustrated in FIG. 3, according to one example of the present disclosure, a data management system 200 may include a chassis 210 defining, or having, multiple sleds, trays, or data device receivers 216 for receiving one or more data devices 212, and two or more network modules 244. As mentioned above, the data devices 212 may include servers, storage devices, or both. Storage devices can take a variety of forms, such as hard disc drives (HDDs), solid-state drives (SSDs), hybrid drives, etc. In an example in which the data device 212 takes the form of a storage device, each of the data devices may include a controller and computer memory to provide storage of data. In a cloud computing environment, data may be stored in the form of objects (partitions) of selected size and duplicated a number of times in different zones in different storage devices. It is contemplated that the data devices 212 are 3.5 inch (in.) form factor HDDs with nominal length and width dimensions of 5.75 in.×4.0 in. Other styles and form factors of storage devices can be used, including but not limited to 2.5 in. form factor devices with nominal dimensions of 4.0 in.×2.88 in.

Each of the network modules 244 in the data management system of FIG. 3 may be similar to the network modules 144 described above in FIG. 2, and may include couplings (e.g., optical couplings) proximate, or formed along, an interface (e.g., an optical interface) and a number of channels that extend therein to define the network topology. Each of the network modules 244 may define a different network topology such that a user may operably couple a network module 244 to network module receiver 240 of the chassis 210 to define a network topology for interconnecting a desired combination of data devices 212. As shown, the network module receiver 240 includes multiple couplings 246 that correspond to the couplings 252 of the network modules 244 when the network modules 244 are inserted within the network module receiver 240, and that connect the network module receiver 240 and the printed circuit board so that each of the optical couplings 246 may be traced backed to one or more sleds, or data device receivers, 216, and in turn to the data devices 212 that are included within the one or more sleds 216. The number of channels of the network module 244 that extend between the couplings 252 within each of the network modules 244 and the specific optical pathways formed by the channels between the optical couplings 252 differ for each of the network modules 244 so as to operatively define different network topologies for the interconnecting the data devices 212 associated with each of the network modules 244.

It is understood that while a single chassis 210 with multiple devices 212 within multiple data device receivers 216 is shown in FIG. 3, one example may include two or more chassis 210, so that the system may operably couple data devices 212 within multiple sleds, or data device receivers 216 between two or more separate chassis 110, 210 located within a single rack, or located within different, separate racks. Therefore, the present disclosure provides an apparatus and system for changing the interconnect topology of a data center system such as a storage, switch or compute enclosure to accommodate either different internal or external topologies without the need to change the entire enclosure. In this way, the internal interconnect topology of a data center system enclosure may be changed passively, meaning they include no additional electronics or require no power to operate, by providing, within the enclosure, a generic fixed internal optical interconnect network, which is mapped into a given topology through one or more pluggable, passively interchangeable network modules.

Figure 4:
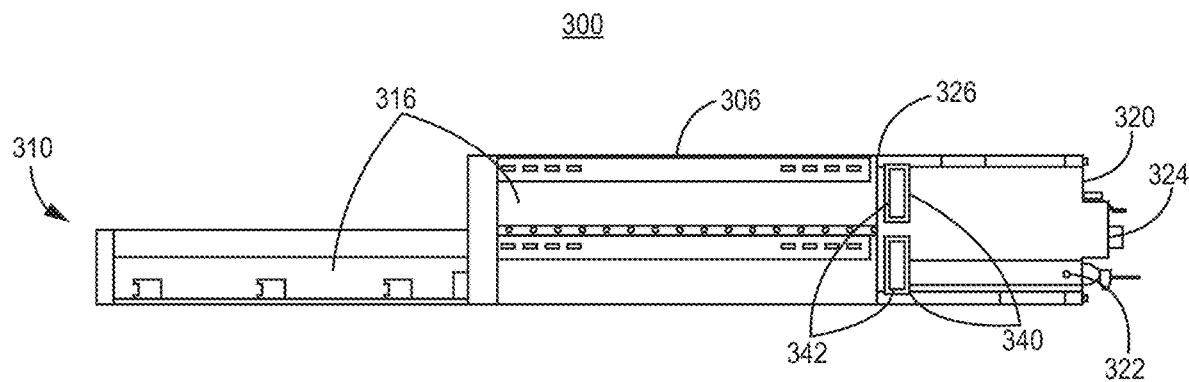
FIG. 4 is a side view of an example apparatus for selectively modifying an optical interconnect topology between data devices, according to an example of the present disclosure.
Figure 5:
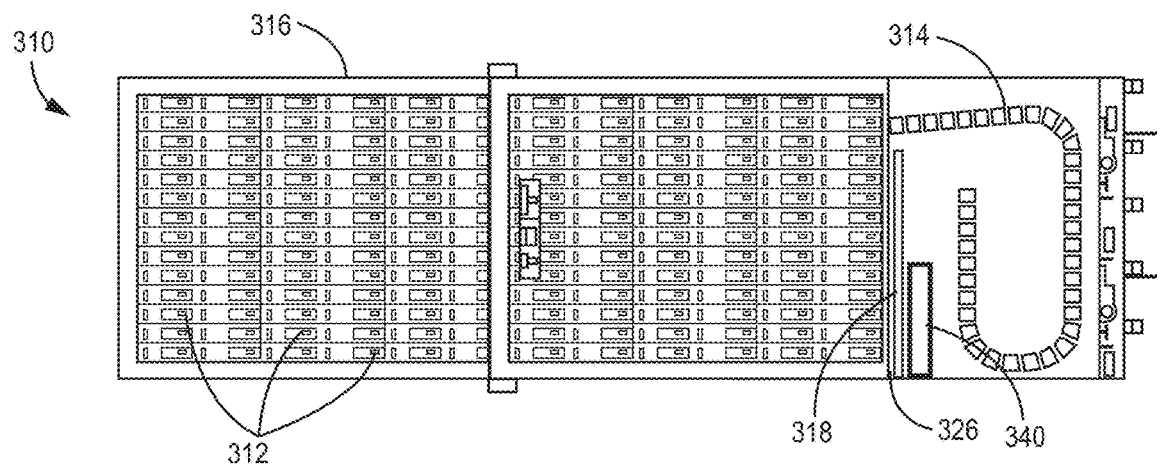
FIG. 5 is a top view of the apparatus for selectively modifying an optical interconnect topology between data devices of FIG. 4.

FIG. 4 is a side view of an example apparatus for selectively modifying an optical interconnect topology between data devices, according to an example of the present disclosure. FIG. 5 is a top view of the apparatus for selectively modifying an optical interconnect topology between data devices of FIG. 4. As illustrated in FIGS. 4 and 5, according to an example of the present disclosure, a data management system 300 may include a chassis 310 that takes the form of a draw or drawer based system that includes dual sleds, trays, or data device receivers 316, extendable from and received within a dual drawer module 306, for receiving one or more data devices 312. In the example of FIGS. 4 and 5, one of the data device receivers 316 is shown positioned fully within the drawer module 306 and a second one of the data device receivers 316 is shown positioned to extend from and outside the drawer module 306. The chassis 310 further includes a moveable cable chain 314 that includes power and data cables for providing power to and providing coupling between the data devices 312, in addition to controller or input/output modules 320, a power source unit 322, and fan modules 324. In one example, each of the data device receivers 316 may include 42 drive bays or data device receivers 316 for receiving data devices 312, formed for example, in 3 rows of 14 data device receivers 316. As mentioned above, the data devices 312 may include servers, storage devices, or both. Storage devices can take a variety of forms, such as hard disc drives (HDDs), solid-state drives (SSDs), hybrid drives, etc. In an example in which the data device 312 takes the form of a storage device, each of the data devices may include a controller and computer memory to provide storage of data. In a cloud computing environment, data may be stored in the form of objects (partitions) of selected size and duplicated a number of times in different zones in different storage devices.

The chassis 310 includes network module receivers 340, each positioned along a printed circuit board (PCB) 318 located at an end 326 of the drawer module 306 so as to be positioned along a single one of the data device receivers 316 between the drawer module 306 and the controller or input/output modules 318, the power source unit 320, and the fan modules 322. Similar to the examples described above, the network module receivers 340 provide electrical interconnection paths for the various data devices 312 and sled or drawer electronics of the drawers of the associated data device receiver 316.

As described above, each of the network module receivers 340 includes an opening 342, formed to receive a network module described above, and include multiple couplings that correspond to the couplings of the network modules when the network modules are inserted within the network module receiver 340. The couplings further connect the network module receiver 340 and chassis 310 so that each of the optical couplings may be traced backed to one or more drawers, or data device receivers 316, and in turn, to the data devices 312 that are included within the one or more drawers 316. As described above, the number of channels of the network module that extend between the couplings within each of the network modules and the specific optical pathways formed by the channels between the optical couplings differ for each of the network modules so as to operatively define different network topologies for the interconnecting the data devices 312 associated with each of the network modules.

It may be described that the apparatus for enabling selection of a desired optical interconnect topology between data devices of the present disclosure may be included in a data management system in which internal high-speed connections between data devices are implemented through optical links, such as optical fibre jumpers, flexplanes or other connectors. Each of the optical links connecting the data devices may be selectively capable of passing through one or more network modules, depending upon the configuration of specific optical channels formed within a given selected network module. As a result, rather than having direct fixed optical links connecting the data devices to each other according to a specific topology, a current interconnect topology may be replaced by a different interconnect topology by removing the network module configured to define the current interconnect topology and replacing the network module with another network module configured to enable a different interconnect topology between the data devices.

In one example, the network module may be a passive fiber shuffle cassette with a high-density pluggable optical I/O interface located on the connecting end of the cassette and a given interconnect topology fixed within the cassette. Depending on how the optical fibers in the network module are mapped to the connector interfaces of the network module, a given interconnect topology between the data devices will be implemented. Since the network modules are passive, meaning they include no additional electronics and require no power to operate, optically pluggable and interchangeable, different interconnect topologies for the data devices may be selected and implemented by removing the network module that is currently being utilized and inserting another network module defining a different interconnect topology for interconnecting the data devices.

An example of an interconnect topology may be an interconnect topology in which nothing is shared by the data devices, that is to say a non-redundant interconnect topology. Another example interconnect topology may be a dual star topology HA (High Availability). Another example interconnect topology may be an end node bypass topology in which all optical links from each drive may be routed directly, via the topology module, to the front fascia of one or more controller modules, bypassing the expander or otherwise on the controller module. This would allow direct passive connectivity to the drives by another system that may be located on the other side of the data center. Another example interconnect topology may be a controller module bypass topology, whereby the optical connections from the controller modules are routed directly passively out through the front fascia of the controller modules (instead of to the drives or other subsystems of the same enclosure), thus allowing those controller modules to directly communicate with a drive cluster in one or more other systems. Another example interconnect topology may be a system internal torus network that supports internal n-dimensional torus networks between nodes in the system, where each drive is a torus node, for example. Another example interconnect topology may be a system external torus network supporting a larger n-dimensional torus network between many enclosures, which may be distributed over the data center, and which treats all or a sub-set of subsystems in a given enclosure as nodes in a larger torus network.

Thus, embodiments of NETWORK TOPOLOGY MODULES are disclosed. Although reference is made to the accompanying set of drawings that form a part hereof and in which are shown by way of illustration several specific embodiments, it is to be understood that other embodiments are contemplated and may be made without departing from (e.g., still falling within) the scope or spirit of the present disclosure. The detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The terms "coupled" or "connected" refer to elements being attached to each other either directly (in direct contact with each other) or indirectly (having one or more elements between and attaching the two elements).

Terms related to orientation, such as "top", "bottom", "side", and "end", are used to describe relative positions of components and are not meant to limit the orientation of the embodiments contemplated. For example, an embodiment described as have a component on a "top" of another component also encompasses embodiments thereof rotated in various directions unless the content clearly dictates otherwise.

Reference to "one embodiment," "an embodiment," "certain embodiments," or "some embodiments," etc., means that a particular feature, configuration, composition, or characteristic described in connection with the embodiment is included in at least one embodiment of the disclosure. Thus, the appearances of such phrases in various places throughout are not necessarily referring to the same embodiment of the disclosure. Furthermore, the particular features, configurations, compositions, or characteristics may be combined in any suitable manner in one or more embodiments.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

As used herein, "have", "having", "include", "including", "comprise", "comprising" or the like are used in their open-ended sense, and generally mean "including, but not limited to". It will be understood that "consisting essentially of", "consisting of", and the like are subsumed in "comprising," and the like.

The term "and/or" means one or all of the listed elements or a combination of any two or more of the listed elements (e.g., casting and/or treating an alloy means casting, treating, or both casting and treating the alloy).

The phrases "at least one of," "comprises at least one of," and "one or more of" followed by a list refers to any one of the items in the list and any combination of two or more items in the list.

What is claimed is:

1. A module comprising:
   an optical interface comprising a plurality of optical couplings to interconnect a plurality of data storage devices;
   a plurality of optical channels extending between and operably coupled to the plurality of optical couplings to define one of a plurality of different interconnect topologies for interconnecting the data storage devices; and
   a housing receivable by a chassis that provides the plurality of data storage devices.

2. The module of claim 1, wherein the plurality of optical channels passively transmit signals between the optical couplings.

3. The module of claim 1, wherein the plurality of optical channels define a nothing shared network topology where optical couplings of the data storage devices are not coupled to each other.

4. The network module of claim 1, wherein the plurality of optical channels define one of a dual star network topology, an end node bypass network topology, a controller module bypass network topology, a system internal torus network topology, and a system external torus network topology.

5. A system comprising:
   a network module comprising an optical interface, the optical interface comprising:
   a plurality of optical couplings; and
   a plurality of optical channels extending between the optical couplings to define a network topology for interconnecting one of more data devices; and
   a chassis to receive one or more data devices and the network module to operably couple the received one or more data devices via the network topology defined by the plurality of optical channels of the network module, wherein the chassis extends from a front side to receive the one or more data devices to a back side, wherein the chassis further comprises a network module receiver to receive the network module, wherein the network module is positioned between the front side and the back side.

6. The system of claim 5, wherein the plurality of optical channels passively transmit signals between the optical couplings.

7. The system of claim 5, wherein the plurality of optical channels define a nothing shared network topology where optical couplings of the received data devices are not coupled to each other.

8. The system of claim 5, wherein the plurality of optical channels define one of a dual star network topology, an end node bypass network topology, a controller module bypass network topology, a system internal torus network topology, and a system external torus network topology.

9. A system comprising:
   a network module comprising an optical interface, the optical interface comprising:
   a plurality of optical couplings; and
   a plurality of optical channels extending between the optical couplings to define a network topology for interconnecting one of more data devices; and
   a chassis to receive one or more data devices and the network module to operably couple the received one or more data devices via the network topology defined by the plurality of optical channels of the network module, wherein the chassis extends from a front side to receive the one or more data devices to a back side, wherein the chassis further comprises a network module receiver to receive the network module, wherein the network module receiver is positioned to receive the network module on the front side.

10. The system of claim 5, wherein the chassis is further configured to receive more than one network module.

11. The module of claim 2, wherein the plurality of optical channels define a nothing shared network topology where optical couplings of the data devices are not coupled to each other.

12. The network module of claim 2, wherein the plurality of optical channels define one of a dual star network topology, an end node bypass network topology, a controller module bypass network topology, a system internal torus network topology, and a system external torus network topology.

13. The system of claim 6, wherein the plurality of optical channels define a nothing shared network topology where optical couplings of the received data devices are not coupled to each other.

14. The system of claim 6, wherein the plurality of optical channels define one of a dual star network topology, an end node bypass network topology, a controller module bypass network topology, a system internal torus network topology, and a system external torus network topology.

15. The system of claim 6, wherein the chassis is further configured to receive more than one network module.

16. The system of claim 6, wherein the chassis further comprises a midplane operably couplable to each of the plurality of data devices and operably coupling each of the plurality of data devices to the network module.

17. The system of claim 9, wherein the plurality of optical channels passively transmit signals between the optical couplings.

18. The system of claim 17, wherein the chassis further comprises a midplane operably couplable to each of the plurality of data devices and operably coupling each of the plurality of data devices to the network module.

* * * * *